(12) United States Patent
Navil et al.

(10) Patent No.: US 7,405,633 B2
(45) Date of Patent: Jul. 29, 2008

(54) METHODS AND APPARATUS FOR LOOP BANDWIDTH CONTROL FOR A PHASE-LOCKED LOOP

(75) Inventors: Sharath Navil, Ashburn, VA (US); David W. Fleming, Reston, VA (US)

(73) Assignee: Tellabs Reston, Inc., Ashburn, VA (US)

( * ) Notice: Subject to any disclaimer, the term of this patent is extended or adjusted under 35 U.S.C. 154(b) by 95 days.

(21) Appl. No.: 11/250,292

(22) Filed: Oct. 14, 2005

(65) Prior Publication Data

US 2007/0013446 A1 Jan. 18, 2007

Related U.S. Application Data

(60) Provisional application No. 60/700,515, filed on Jul. 18, 2005.

(51) Int. Cl.
*H03B 1/00* (2006.01)

(52) U.S. Cl. .................. 331/179; 331/16; 331/34; 331/177 R; 331/17

(58) Field of Classification Search .......... 331/16, 331/179, 17, 177 R, 34
See application file for complete search history.

(56) References Cited

U.S. PATENT DOCUMENTS

| | | | |
|---|---|---|---|
| 4,771,249 A | 9/1988 | Burch et al. | |
| 4,920,320 A | 4/1990 | Matthews | |
| 5,703,539 A * | 12/1997 | Gillig et al. | .................. 331/16 |
| 5,754,607 A | 5/1998 | Powell et al. | |
| 6,049,255 A | 4/2000 | Hagberg et al. | |
| 6,704,382 B1 | 3/2004 | Metzler et al. | |
| 2004/0066238 A1 | 4/2004 | Dickmann | |

OTHER PUBLICATIONS

Semtech; ACS85630 Sets; Synchronous Equipment Timing Source for Stratum 2/3E Systems; Revision 3.01/Oct. 2003 © Semtech Corp.; www.semtech.com; 7 pgs.

Phase-locked loop; Wikipedia, free encyclopedia, http//en.wikipedia.org/wiki/phase-locked loop; Jul. 18, 2005; 7 pgs.

* cited by examiner

*Primary Examiner*—Arnold Kinkead
(74) *Attorney, Agent, or Firm*—Dean D Small; Small Patent Law Group

(57) ABSTRACT

A method for controlling loop bandwidth of a phase locked loop is described. The method includes setting the loop bandwidth to a value, calculating at least one of a phase error and a frequency change that occur subsequent to any setting or adjusting of loop bandwidth, and adjusting the loop bandwidth based on at least one of the phase error and the frequency change.

31 Claims, 2 Drawing Sheets

METHODS AND APPARATUS FOR LOOP BANDWIDTH CONTROL FOR A PHASE-LOCKED LOOP

CROSS REFERENCE TO RELATED APPLICATIONS

This application claims priority to U.S. Provisional Application Ser. No. 60/700,515, filed Jul. 18, 2005, which is hereby incorporated by reference in its entirety.

BACKGROUND OF THE INVENTION

This invention relates generally to operation of phase-locked loops, and more specifically, to methods and apparatus for loop bandwidth control of phase-locked loops.

Communications standards, such as GR-253-CORE, "SONET Transport Systems: Common Criteria" and GR-1244-CORE, "Clocks for the Synchronized Network: Common Generic Criteria" specify criteria for the various clocks used in communications equipment for synchronous timing applications. These synchronous timing applications typically use phase-locked loops (PLLs), where a PLL can be an electronic circuit with a voltage or current-driven oscillator that is adjusted to match in phase (and thus lock on) the frequency of an input reference signal. The GR-253-CORE and GR-1244-CORE standards provide MTIE (Maximum Time interval Error) requirements for the cases: after the input reference has been switched, the input reference has changed in frequency or phase, after a holdover. In addition, these standards specify a low bandwidth in order to filter out jitter in the input reference signal. Furthermore, these standards specify a minimum phase error within the MTIE limits.

There are existing methods for controlling operation of PLLs. One existing method uses only two levels of bandwidth, i.e. locked or unlocked. Another existing method requires the capability to measure the instantaneous loop frequency and set the integral loop frequency.

The methods and apparatus described herein helps to achieve the requirements set forth in standards such as GR253-CORE and GR-1244-CORE for stabilizing the phase, after a change in reference or recovery from holdover, within the required time limit, while reducing the jitter associated with a large loop bandwidth change.

BRIEF DESCRIPTION OF THE INVENTION

A method for controlling loop bandwidth of a phase locked loop is provided. The method comprises setting the loop bandwidth to a value, calculating at least one of a phase error and a frequency change that occur subsequent to any setting or adjusting of loop bandwidth, and adjusting the loop bandwidth based on at least one of the phase error and the frequency change A phase-locked loop is provided that comprises an oscillator outputting a frequency, a counter module receiving the frequency from the oscillator, a phase detector receiving a signal from the counter and a reference frequency, and a filter receiving an output of the phase detector. The filter is operable to set a loop bandwidth, calculate at least one of a phase error and a frequency change that occur subsequent to any setting or adjusting of loop bandwidth, and adjust the loop bandwidth based on at least one of the phase error and the frequency change.

A phase-locked loop is provided that is programmed to increment a loop bandwidth when a phase error is above a phase error threshold and the loop bandwidth is below a maximum bandwidth and decrement the loop bandwidth if the phase error is below the phase error threshold, a frequency change is below a frequency change threshold, and the loop bandwidth is above a minimum bandwidth.

DETAILED DESCRIPTION OF THE INVENTION

The methods and apparatus described herein improve upon existing methods for managing operation of phase-locked loops (PLLs) by providing better control over loop bandwidth than the existing methods and by eliminating measurement of an instantaneous loop frequency and setting of an integral loop frequency. Loop bandwidth is the effective control loop range of the PLL. A PLL can only track noise (e.g., changes in phase and/or frequency) within the bandwidth of the PLL. In an exemplary embodiment of the present invention, the loop bandwidth for a PLL is based on integral frequency and phase error measurements. Such exemplary embodiments of the present invention can be incorporated into any type of PLL, for example, linear (analog) PLLs, digital PLLs, or all digital PLLs, where the loop bandwidth can be discreetly changed over a range of values and the integral frequency and phase error can be measured. One exemplary embodiment uses the Semtech ACS8530 PLL. Furthermore, exemplary embodiments of the present invention can be used, not only for synchronous timing applications in communications equipment, but for other PLL applications.

Figure 1:
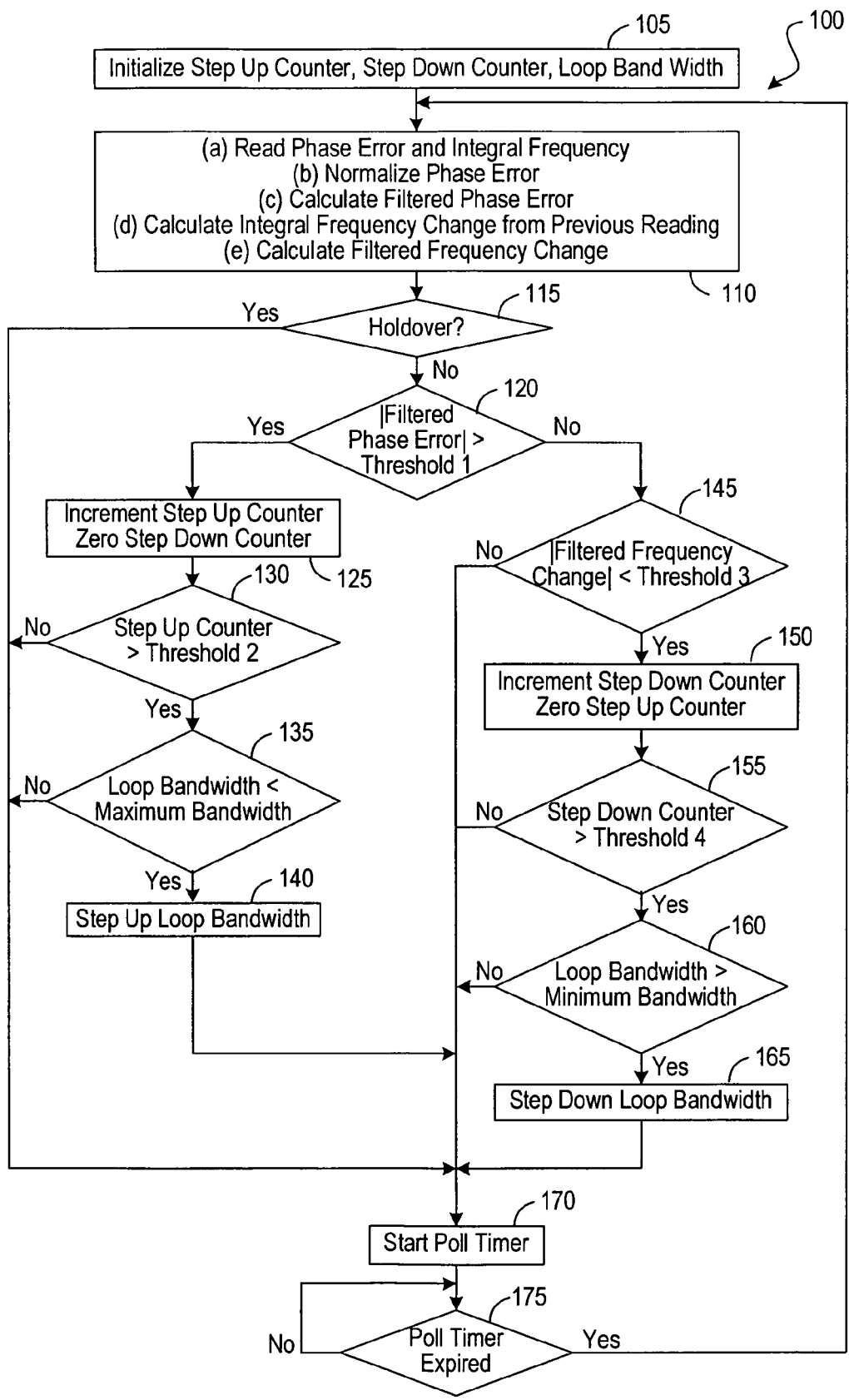
FIG. 1 is a flow-diagram illustrating a method for loop bandwidth control of a phase-locked loop.

FIG. 1 is a flow-diagram illustrating a method for loop bandwidth control in the form of a loop 100, according to exemplary embodiments of the present invention. Some of the actions described in and illustrated by blocks in the flow diagram may be performed in an order other than that which is described. Furthermore, it should be appreciated that not all of the actions in the flow diagrams are required to be performed, that additional actions may be added, and that some of the actions may be substituted with other actions.

Referring specifically to FIG. 1, at block 105, counters step up counter and step down counter are initialized to zero. A loop bandwidth is also initialized to a value dependent on the particular application in which the loop bandwidth is controlled. In an exemplary embodiment, and referring to the Semtech ACS8530 PLL, the register T0_DPLL_locked_bandwidth can be used to set the loop bandwidth and can be initialized to one of the following values: 0.5 MHz, 1 MHz, 2 MHz, 4 MHz, 8 MHz, 15 MHz, 30 MHz, 60 MHz, 0.1 Hz, 0.3 Hz, 0.6 Hz, 1.2 Hz, 2.5 Hz, 8 Hz, 18 Hz, 35 Hz, and 70 Hz. In other exemplary embodiments, a similarly configured register in other PLLs is used to set the loop bandwidth.

At block 110, actions, or a subset of the actions, can be performed, specifically, phase error and integral frequency are read, phase error is normalized, filtered phase error is calculated, integral frequency change is calculated, and filtered frequency change is calculated.

Phase error can be defined as the difference in phase between that of an input reference signal and an output of the voltage controlled oscillator of the PLL. In an exemplary embodiment, and again referring to the Semtech ACS8530 PLL, the register sts_current_phase can be used to read phase error. In other exemplary embodiments, a similar register in another type of PLL can be used to read the phase error. Integral frequency can be defined as the short-term average frequency of the oscillator of the PLL. In an exemplary embodiment using the Semtech ACS8530 PLL, the register sts_current_DPLL_frequency can be used to read the integral frequency. In other exemplary embodiments, a similarly configured register in other PLLs is used to read the integral frequency.

Phase error can be normalized to adjust a reading of zero phase error by the phase detector of the PLL. In one specific embodiment, the phase error is normalized as follows: if the phase error reading is not negative (i.e. zero or a positive value), one is added to it.

The filtered phase error can be calculated according to: $F_{phase\ error}(i+1)=(D_{phase\ error}\times(F(i))+G_{phase\ error}\times(X_{phase\ error}(i+1))+R(i))/(D_{phase\ error}+1)$, where: $F(i)$ is the integer filter result (output from the filter) from reading (i); $X_{phase\ error}(i)$ is the phase error at reading (i); $R(i)$ is the remainder filter result (output from the filter) from reading (i); $D_{phase\ error}$ is a damping factor, (set for filtered phase error calculations), adding weight to the stored value; $G_{phase\ error}$ is a gain factor, (set for filtered phase error calculations), adding weight and resolution to the input value; and $F_{phase\ error}(i+1)$ is the filtered phase error. In an exemplary embodiment, the value of $D_{phase\ error}$ is two and $G_{phase\ error}$ is ten.

Integral frequency change is calculated by taking the difference between the current reading of the integral frequency and a prior reading of the integral frequency. Filtered Frequency Change can be calculated according to: $F_{frequency\ change}(i+1)=(D_{frequency\ change}\times(F(i))+G_{frequency\ change}\times(X_{frequency\ change}(i+1))+R(i))/(D_{frequency\ change}+1)$, where, $F(i)$ is the integer filter result (output from the filter) from reading (i); $X_{frequency\ change}(i)$ is the integral frequency change at reading (i); $R(i)$ is the remainder filter result (output from the filter) from reading (i); $D_{frequency\ change}$ is a damping factor, (set for filtered frequency change calculations), adding weight to the stored value; $G_{frequency\ change}$ is a gain factor, (set for filtered frequency change calculations), adding weight and resolution to the input value; and $F_{frequency\ change}(i+1)$ is the filtered frequency change. In an exemplary embodiment, the value of $D_{frequency\ change}$ is three and $G_{frequency\ change}$ is one.

In another exemplary embodiment, a filtered value of the integral frequency (filtered integral frequency) can be used in place of integral frequency. Filtered integral frequency can be calculated according to $F_{integral\ frequency}(i+1)=(D_{integral\ frequency}\times(F(i))+G_{integral\ frequency}\times(X_{integral\ frequency}(i+1))+R(i))/(D+1)$, where, $F(i)$ is the integer filter result (output from the filter) from reading (i); $X_{integral\ frequency}(i)$ is the integral frequency at reading (i); $R(i)$ is the remainder filter result (output from the filter) from reading (i); $D_{integral\ frequency}$ is a damping factor, (set for filtered integral frequency calculations), adding weight to the stored value; $G_{integral\ frequency}$ is a gain factor, (set for filtered integral frequency calculations), adding weight and resolution to the input value; and $F_{integral\ frequency}(i+1)$ is the filtered integral frequency.

At block 115, the PLL is checked to determine if it is in a holdover state. During holdover, the input reference frequency source to the PLL becomes invalid and no other valid replacement input frequency is available. During holdover, the PLL can use stored frequency data, acquired when the input reference frequency source was still valid, to control the output frequency of the PLL. If there is currently a holdover, the next block is 170. Otherwise, the next block is 120.

At block 120, the absolute value of the filtered phase error is compared with threshold one. Threshold one is a predetermined value based on the particular application in which the loop bandwidth is controlled. An exemplary embodiment value for Threshold one is twenty, but values in the range of one to ten times the $G_{phase\ error}$ may be used. If the absolute value of the filtered phase error is greater than threshold one, the next block is 125. Otherwise, the next block is 145.

If the absolute value of the filter phase error is not greater than threshold one, at block 145, the absolute value of the filter frequency change is compared with threshold three. Threshold three is a predetermined value based on the particular application in which the loop bandwidth is controlled. An exemplary embodiment value for threshold three is five, but values in the range of one to ten times the $G_{frequency\ change}$ can be used. If the absolute value of the filter frequency change is less than threshold three, the next block is 170. Otherwise, the next block is 150.

At block 150, a step down counter is incremented and the step up counter is set to zero. At block 155, the step down counter is compared with threshold four. Threshold four is a predetermined amount, dependent on the particular application. An exemplary embodiment value for threshold four is fifteen, but other values within the range of ten to twenty can be used, depending on the time to wait before stepping down the loop bandwidth. If the step down counter is greater than threshold four, the next block is 160. Otherwise the next block is 170.

At block 160, the loop bandwidth is compared with the minimum bandwidth. Minimum bandwidth is a predetermined amount, dependent on the particular application. In an exemplary embodiment using the Semtech ACS8530 PLL, the minimum and maximum bandwidths range from 70 Hz to 0.5 MHz. If the loop bandwidth is greater than the minimum bandwidth, the next block is 165. Otherwise the next block is 170.

At block 165, the loop bandwidth is decreased by a predetermined amount, dependent on the particular application. In an exemplary embodiment using the Semtech ACS8530 PLL, the register T0_DPLL_locked_bandwidth, used to set the loop bandwidth, can be decreased or stepped down to any of the following values: 0.5 MHz, 1 MHz, 2 MHz, 4 MHz, 8 MHz, 15 MHz, 30 MHz, 60 MHz, 0.1 Hz, 0.3 Hz, 0.6 Hz, 1.2 Hz, 2.5 Hz, 8 Hz, 18 Hz, 35 Hz, and 70 Hz. In other exemplary embodiments, the loop bandwidth may be decreased, but using other values. The next block is 170.

At block 170, a poll timer is started. The poll timer has an expiration value that is a predetermined amount, dependent on the particular application. An exemplary embodiment poll timer expiration value is one second, but values within the range of 100 ms to five seconds can be used. The next block is block 175. At block 175, if the Poll Timer has expired, the next block is 110. Otherwise, block 175 is repeated until the poll timer has expired.

Referring back to block 120, if the absolute value of the filter phase error is greater than threshold one, the next block is 125. At block 125, the step up counter is incremented and the step down counter is set to zero. The next block is block 130.

At block 130, the step up counter is compared with threshold two. Threshold two is a predetermined amount, dependent on the particular application. An exemplary embodiment value of Threshold two is ten, but values within the range of five to fifteen, depending on the time to wait before stepping up the loop bandwidth can be used. If the step up counter is greater than threshold two, the next block is 135. Otherwise, the next block is block 170.

At block 135, the loop bandwidth is compared with the maximum bandwidth. Maximum bandwidth is a predetermined amount, dependent on the particular application. In an exemplary embodiment using the Semtech ACS8530 PLL, the minimum and maximum bandwidths range from 70 Hz to 0.5 MHz. If the loop bandwidth is less than the maximum bandwidth, the next block is 140. Otherwise the next block is block 170.

At block 140, the loop bandwidth is increased by a predetermined amount, dependent on the particular application or PLL used. In an exemplary embodiment using the Semtech ACS8530 PLL, the register T0_DPLL_locked_bandwidth, used to set the loop bandwidth, can be increased or stepped up to any of the following values: 0.5 MHz, 1 MHz, 2 MHz, 4 MHz, 8 MHz, 15 MHz, 30 MHz, 60 MHz, 0.1 Hz, 0.3 Hz, 0.6 Hz, 1.2 Hz, 2.5 Hz, 8 Hz, 18 Hz, 35 Hz, and 70 Hz. In other exemplary embodiments, the loop bandwidth may be increased, but using other values. The next block is 170.

Figure 2:
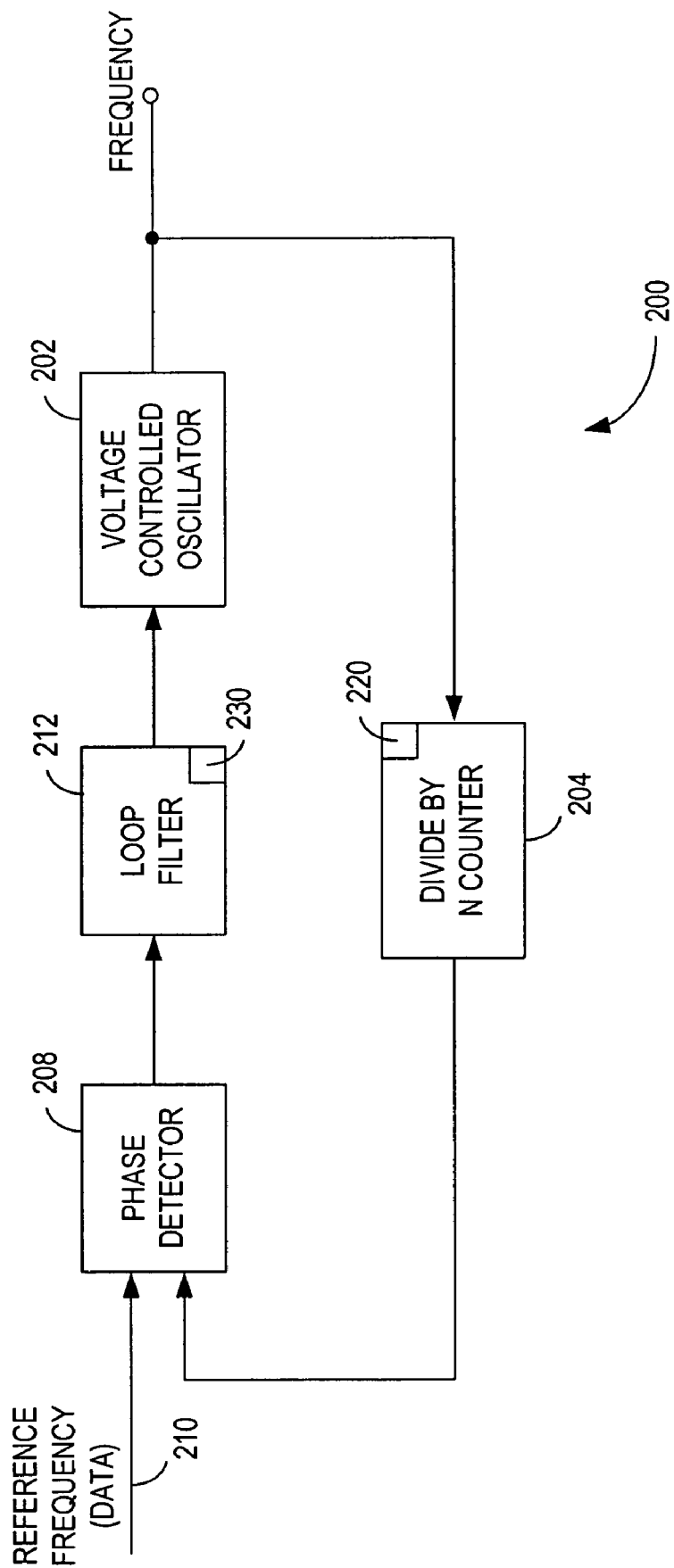
FIG. 2 is a block diagram of a phase-locked loop configured for loop bandwidth control.

FIG. 2 is a block diagram of a phase-locked loop 200 configured to implement the above described methods. Specifically, phase-locked loop includes an oscillator 202 providing an output frequency that is also provided to a counter 204. The phase locked loop 200 further includes a phase detector 208 receiving a signal originating from counter 204 and a reference frequency 210 that may include data. An output of the phase detector 208 includes a phase error, based on a comparison of counter 204 output and the reference frequency 210, at an integral frequency which is input to loop filter 212, whose output controls operation of oscillator 202, for example, a voltage controlled oscillator, thereby completing the loop of the phase-locked loop 200.

In an embodiment, based on the phase error and integral frequency inputs, the loop filter 212 is programmed to adjust the loop bandwidth of the PLL 200 based on the signal output to oscillator 202. As described above with respect to FIG. 1, PLL 200 is programmed to reset step up and step down counter registers 220 within counter 204 to zero and the loop filter 212 is initialized to a value which provides a bandwidth applicable for the application.

As the PLL 200 operates, phase error and integral frequency are read within loop filter 212, stored within registers as described above, and the phase error is normalized. Loop filter 212 then is programmed to calculate a filtered phase error and the integral frequency change. The loop filter 212 then calculates a filtered frequency change which is utilized to adjust operation of oscillator 202.

The PLL 200 further is configured to determined a holdover. During holdover the PLL 200 uses stored frequency data to adjust operation of the oscillator 202 and the reference frequency 210 is ignored. PLL 200 further includes registers 230 that retain the threshold values described above. Loop filter 212 is programmed to compare loop bandwidth to the minimum and maximum bandwidths and to make adjustments to the loop bandwidth register based on the phase error.

In the foregoing description, the invention is described with reference to specific example embodiments thereof. It will, however, be evident that various modifications and changes may be made thereto, without departing from the broader spirit and scope of the present invention. For example, embodiments of the present invention may be provided as a computer program product, or software, that may include a machine-readable medium having stored thereon instructions. Further, a machine-readable medium may be used to program a computer system or other electronic device and the readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions. The specification and drawings are accordingly to be regarded in an illustrative rather than in a restrictive sense.

While the invention has been described in terms of various specific embodiments, those skilled in the art will recognize that the invention can be practiced with modification within the spirit and scope of the claims.

What is claimed is:

1. A method for controlling loop bandwidth of a phase locked loop comprising:
    setting the loop bandwidth to a value;
    calculating a filtered phase error that occurs subsequent to any setting or adjusting of loop bandwidth; and
    adjusting the loop bandwidth based on the filtered phase error, wherein calculating the phase error comprises calculating an average phase error according to:
    $F_{phase\ error}(i+1) = (D_{phase\ error}(F(i)) + G_{phase\ error} \times (X_{phase\ error}(i+1)) + R(i))/(D_{phase\ error}+1)$, where, i is an integer, F(i) is a filter output from reading (i), $X_{phase\ error}(i)$ is the phase error at reading (i), R(i) is a remainder output from the filter from reading (i), $D_{phase\ error}$ is a damping factor, and $G_{phase\ error}$ is a gain factor.

2. A method according to claim 1 wherein adjusting the loop bandwidth comprises incrementing the loop bandwidth when one or more of the calculated phase error is above a phase error threshold and the loop bandwidth is below a maximum bandwidth.

3. A method according to claim 1 wherein adjusting the loop bandwidth comprises decrementing the loop bandwidth when one or more of the calculated phase error is below a phase error threshold and the loop bandwidth is above a minimum bandwidth.

4. A method according to claim 1 further comprising repeating the calculating and adjusting steps upon expiration of a poll timer.

5. A method for controlling loop bandwidth of a phase locked loop comprising:
    setting the loop bandwidth to a value;
    calculating at least one of a phase error and a frequency change that occur subsequent to any setting or adjusting of loop bandwidth; and
    adjusting the loop bandwidth based on at least one of the phase error and the frequency change, wherein calculating at least one of a phase error and a frequency change comprises reading a stored frequency change and phase error, the stored frequency change being an average frequency change of an oscillator of the phase-locked loop over a term and the phase error being an average phase error of an oscillator of the phase-locked loop over a term.

6. A method for controlling loop bandwidth of a phase locked loop comprising:
    setting the loop bandwidth to a value;
    calculating a filtered frequency change that occur subsequent to any setting or adjusting of loop bandwidth; and
    adjusting the loop bandwidth based on the filtered frequency change, wherein calculating the frequency change comprises calculating an average frequency change according to:
    $F_{frequency\ change}(i+1) = (D_{frequency\ change} \times (F(i)) + G_{frequency\ change} \times (X_{frequency\ change}(i+1)) + R(i))/(D_{frequency\ change}+1)$, where, i is an integer, F(i) is an integer filter result from reading (i), $X_{frequency\ change}(i)$ is an integral frequency change at reading (i), R(i) is a remainder filter result from reading (i), $D_{frequency\ change}$ is a damping factor, $G_{frequency\ change}$ is a gain factor.

7. A method according to claim 1 wherein adjusting the loop bandwidth comprises:
   adjusting at least one counter; and
   stepping up the loop bandwidth if the loop bandwidth is below a maximum bandwidth.

8. A method according to claim 1 wherein adjusting the loop bandwidth comprises:
   adjusting at least one counter; and
   stepping down the loop bandwidth if the loop bandwidth is above a minimum bandwidth.

9. A method according to claim 1 further comprising starting a poll timer after incrementing or decrementing the loop bandwidth.

10. A phase-locked loop comprising:
   an oscillator outputting a frequency;
   a counter module receiving the frequency from said oscillator;
   a phase detector receiving a signal from said counter and a reference frequency; and
   a filter receiving an output of said phase detector, said filter operable to set a loop bandwidth, calculate a phase error that occur subsequent to any setting or adjusting of loop bandwidth, and adjust the loop bandwidth based on the phase error, wherein said filter calculates the phase error according to:
   $F_{phase\ error}(i+1)=(D\times(F(i))+G\times(X_{phase\ error}(i+1))+R(i))/(D+1)$, where, i is an integer. $F(i)$ is a filter output from reading (i); $X_{phase\ error}(i)$ is the phase error at reading (i); $R(i)$ is a remainder output from the filter from reading (i); $D_{phase\ error}$ is a damping factor, and $G_{phase\ error}$ is a gain factor.

11. A phase locked loop according to claim 10 wherein to adjust the loop bandwidth, said filter is programmed to increment the loop bandwidth when one or more of the calculated phase error is above a phase error threshold and the loop bandwidth is below a maximum bandwidth.

12. A phase locked loop according to claim 10 wherein to adjust the loop bandwidth, said filter is programmed to decrement the loop bandwidth when one or more of the calculated phase error is below the phase error threshold, and the loop bandwidth is above a minimum bandwidth.

13. A phase-locked loop according to claim 10 comprising a plurality of registers storing data relating to phase errors, loop bandwidth, frequency, and frequency changes.

14. A phase-locked loop according to claim 10 wherein when at least one of a calculated phase error is above a phase error threshold and the loop bandwidth is below a maximum bandwidth:
   said counter module increments a step up counter and sets a step down counter to zero; and
   said filter steps up the loop bandwidth if the loop bandwidth is below a maximum bandwidth.

15. A phase-locked loop according to claim 10 wherein when at least one of a calculated phase error is below the phase error threshold, a frequency change is below a frequency change threshold, and the loop bandwidth is above a minimum bandwidth:
   said counter module increments a step down counter and sets a step up counter to zero; and
   said filter steps down the loop bandwidth if the loop bandwidth is above a minimum bandwidth.

16. A phase-locked loop according to claim 10 wherein said counter module comprises a poll timer that is started after a change in loop bandwidth.

17. The method according to claim 1, wherein the phase error comprises an average phase error of the phase-locked loop over a term.

18. The method according to claim 6, wherein the frequency change comprises an average frequency change of the phase-locked loop over a term.

19. The method according to claim 10, wherein the phase error comprises an average phase error of the phase-locked loop over a term.

20. The method according to claim 5 wherein adjusting the loop bandwidth comprises incrementing the loop bandwidth when one or more of the calculated phase error is above a phase error threshold and the loop bandwidth is below a maximum bandwidth.

21. The method according to claim 5 wherein adjusting the loop bandwidth comprises decrementing the loop bandwidth when one or more of the calculated phase error is below a phase error threshold, a frequency change is below a frequency change threshold, and the loop bandwidth is above a minimum bandwidth.

22. The method according to claim 5 further comprising repeating the calculating and adjusting steps upon expiration of a poll timer.

23. The method according to claim 5 wherein adjusting the loop bandwidth comprises:
   adjusting at least one counter; and
   stepping up the loop bandwidth if the loop bandwidth is below a maximum bandwidth.

24. The method according to claim 5 wherein adjusting the loop bandwidth comprises:
   adjusting at least one counter; and
   stepping down the loop bandwidth if the loop bandwidth is above a minimum bandwidth.

25. The method according to claim 5 further comprising starting a poll timer after incrementing or decrementing the loop bandwidth.

26. The method according to claim 6 wherein adjusting the loop bandwidth comprises incrementing the loop bandwidth when one or more of a calculated phase error is above a phase error threshold and the loop bandwidth is below a maximum bandwidth.

27. The method according to claim 6 wherein adjusting the loop bandwidth comprises decrementing the loop bandwidth when one or more of a calculated phase error is below a phase error threshold, a frequency change is below a frequency change threshold, and the loop bandwidth is above a minimum bandwidth.

28. The method according to claim 6 further comprising repeating the calculating and adjusting steps upon expiration of a poll timer.

29. The method according to claim 6 wherein adjusting the loop bandwidth comprises:
   adjusting at least one counter; and
   stepping up the loop bandwidth if the loop bandwidth is below a maximum bandwidth.

30. The method according to claim 6 wherein adjusting the loop bandwidth comprises:
   adjusting at least one counter; and
   stepping down the loop bandwidth if the loop bandwidth is above a minimum bandwidth.

31. The method according to claim 6 further comprising starting a poll timer after incrementing or decrementing the loop bandwidth.

* * * * *

UNITED STATES PATENT AND TRADEMARK OFFICE
CERTIFICATE OF CORRECTION

PATENT NO. : 7,405,633 B2
APPLICATION NO. : 11/250292
DATED : July 29, 2008
INVENTOR(S) : Navil et al.

Page 1 of 1

It is certified that error appears in the above-identified patent and that said Letters Patent is hereby corrected as shown below:

Col. 6, claim 1 should read as follows:

1. A method for controlling loop bandwidth of a phase locked loop comprising:
setting the loop bandwidth to a value;
calculating a filtered phase error that occurs subsequent to any setting or adjusting of loop bandwidth; and
adjusting the loop bandwidth based on the filtered phase error, wherein calculating the phase error comprises calculating an average phase error according to:

$$F_{phase\ error}(i+1) = (D_{phase\ error} \times (F(i)) + G_{phase\ error} \times (X_{phase\ error}(i+1)) + R(i)) / (D_{phase\ error} + 1),$$

where, i is an integer, $F(i)$ is a filter output from reading (i), $X_{phase\ error}(i)$ is the phase error at reading (i), $R(i)$ is a remainder output from the filter from reading (i), $D_{phase\ error}$ is a damping factor, and $G_{phase\ error}$ is a gain factor.

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,405,633 B2　　　　　　　　　　　　　　　　　　　　　　Page 1 of 1
APPLICATION NO. : 11/250292
DATED : July 29, 2008
INVENTOR(S) : Navil et al.

It is certified that error appears in the above-identified patent and that said Letters Patent is hereby corrected as shown below:

Col. 6, claim 1, lines 9-23, should read as follows:

1. A method for controlling loop bandwidth of a phase locked loop comprising:
setting the loop bandwidth to a value;
calculating a filtered phase error that occurs subsequent to any setting or adjusting of loop bandwidth; and
adjusting the loop bandwidth based on the filtered phase error, wherein calculating the phase error comprises calculating an average phase error according to:

$$F_{phase\ error}(i+1) = (D_{phase\ error} \times (F(i)) + G_{phase\ error} \times (X_{phase\ error}(i+1)) + R(i)) / (D_{phase\ error} + 1),$$

where, i is an integer, F(i) is a filter output from reading (i), $X_{phase\ error}(i)$ is the phase error at reading (i), R(i) is a remainder output from the filter from reading (i), $D_{phase\ error}$ is a damping factor, and $G_{phase\ error}$ is a gain factor.

This certificate supersedes the Certificate of Correction issued May 19, 2009.

Signed and Sealed this

Ninth Day of June, 2009

JOHN DOLL
*Acting Director of the United States Patent and Trademark Office*